United States Patent
Wang (10) Patent No.: US 12,028,036 B2
(45) Date of Patent: Jul. 2, 2024

(54) POWER AMPLIFIER WITH HARMONIC FILTER

(71) Applicant: RichWave Technology Corp., Taipei (TW)

(72) Inventor: Yi-Fong Wang, Taipei (TW)

(73) Assignee: RichWave Technology Corp., Taipei (TW)

(*) Notice: Subject to any disclaimer, the term of this patent is extended or adjusted under 35 U.S.C. 154(b) by 435 days.

(21) Appl. No.: 17/395,476

(22) Filed: Aug. 6, 2021

(65) Prior Publication Data

US 2022/0360243 A1 Nov. 10, 2022

(30) Foreign Application Priority Data

May 6, 2021 (TW) .................................. 110116343

(51) Int. Cl.
*H03F 3/19* (2006.01)
*H03F 1/56* (2006.01)
*H03H 7/01* (2006.01)

(52) U.S. Cl.
CPC ............. *H03H 7/0115* (2013.01); *H03F 3/19* (2013.01); *H03H 7/1766* (2013.01); *H03F 2200/165* (2013.01); *H03F 2200/451* (2013.01)

(58) Field of Classification Search
CPC .. H03H 7/0115; H03H 7/1766; H03H 7/0123; H03H 7/1783; H03H 2007/013; H03F 3/19; H03F 2200/165; H03F 2200/451; H03F 1/32; H03F 1/565; H03F 3/195; H03F 3/60; H03F 2200/411; H03F 3/21; H01P 1/2039; H01P 1/212
USPC .......................................... 330/294, 302–305
See application file for complete search history.

(56) References Cited

U.S. PATENT DOCUMENTS 6,289,204 B1 9/2001 Estes
7,202,736 B1 * 4/2007 Dow ........................ H03F 1/30
330/129

FOREIGN PATENT DOCUMENTS

| CN | 106100591 A | 11/2016 |
| CN | 106416061 A | 2/2017 |
| CN | 106603017 A | 4/2017 |
| CN | 106797222 A | 5/2017 |

(Continued)

OTHER PUBLICATIONS

Office action mailed on Apr. 14, 2022 for the Taiwan application No. 110116343, filing date May 6, 2021, pp. 1-5.

*Primary Examiner* — Hieu P Nguyen
(74) *Attorney, Agent, or Firm* — Winston Hsu (57) ABSTRACT

The present invention discloses an amplifier. The bias amplifier includes a signal input end, for inputting an input signal; a voltage input end, for inputting a source voltage; an amplifying circuit, for generating an amplified input signal according to the input signal, and the amplified input signal comprises a fundamental signal, a first harmonic signal and a second harmonic signal, wherein the first harmonic signal is a second order harmonic of the fundamental signal, and the second harmonic signal is a third order harmonic of the fundamental signal; a harmonic filter, coupled between the voltage input end and the amplifying circuit, for filtering the first harmonic signal and the second harmonic signal; and a signal output end, coupled to the harmonic filter, for outputting an output signal according to the amplified input signal.

20 Claims, 10 Drawing Sheets

(56) References Cited

FOREIGN PATENT DOCUMENTS

| CN | 109104159 A | 12/2018 |
|---|---|---|
| TW | 202017311 A | 5/2020 |

\* cited by examiner

POWER AMPLIFIER WITH HARMONIC FILTER

TECHNICAL FIELD

The present invention relates to a power amplifier, and more particularly, to a power amplifier with a harmonic filter.

BACKGROUND

Radio frequency (RF) power amplifiers (PAs) are widely used in several circuits for improving signal quality of the circuits. An input signal generates harmonics during an operating process, which affects performance and efficiency of the circuits. According to the prior art, a λ/4 transmission line can only filter a second order harmonic generated by the input signal in the circuit, but cannot filter a third order harmonic generated by the input signal in the circuit. In addition, the λ/4 transmission line is with a smaller input signal bandwidth and an area (or a volume) of the λ/4 transmission line is large, which makes the λ/4 transmission line susceptible to interference. Thus, how to handle and filter the harmonic generated by the input signal passing through the power amplifier is a problem to be solved.

SUMMARY

It is therefore an objective of the present invention to provide a power amplifier with harmonic filter to solve the problems above.

The present invention discloses an amplifier. The bias amplifier includes a signal input end, for inputting an input signal; a voltage input end, for inputting a source voltage; an amplifying circuit, for generating an amplified input signal according to the input signal, and the amplified input signal comprises a fundamental signal, a first harmonic signal and a second harmonic signal, wherein the first harmonic signal is a second order harmonic of the fundamental signal, and the second harmonic signal is a third order harmonic of the fundamental signal; a harmonic filter, coupled between the voltage input end and the amplifying circuit, for filtering the first harmonic signal and the second harmonic signal; and a signal output end, coupled to the harmonic filter, for outputting an output signal according to the amplified input signal.

The present invention further discloses a harmonic filter. The harmonic filter includes a resonator, including a first end, coupled to a voltage input end; and a second end, for receiving an input signal, wherein the input signal comprises a fundamental signal, a first harmonic signal and a second harmonic signal, and a first impedance value and a second impedance value of the first harmonic signal and the second harmonic signal in the resonator are smaller than a third impedance value of the fundamental signal in the resonator; and a bypass capacitor circuit, including a first end, coupled to the voltage input end; and a second end, coupled to a reference voltage end, wherein a fourth impedance value and a fifth impedance value of the first harmonic signal and the second harmonic signal in the bypass capacitor circuit are smaller than a sixth impedance value of the fundamental signal in the bypass capacitor circuit.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
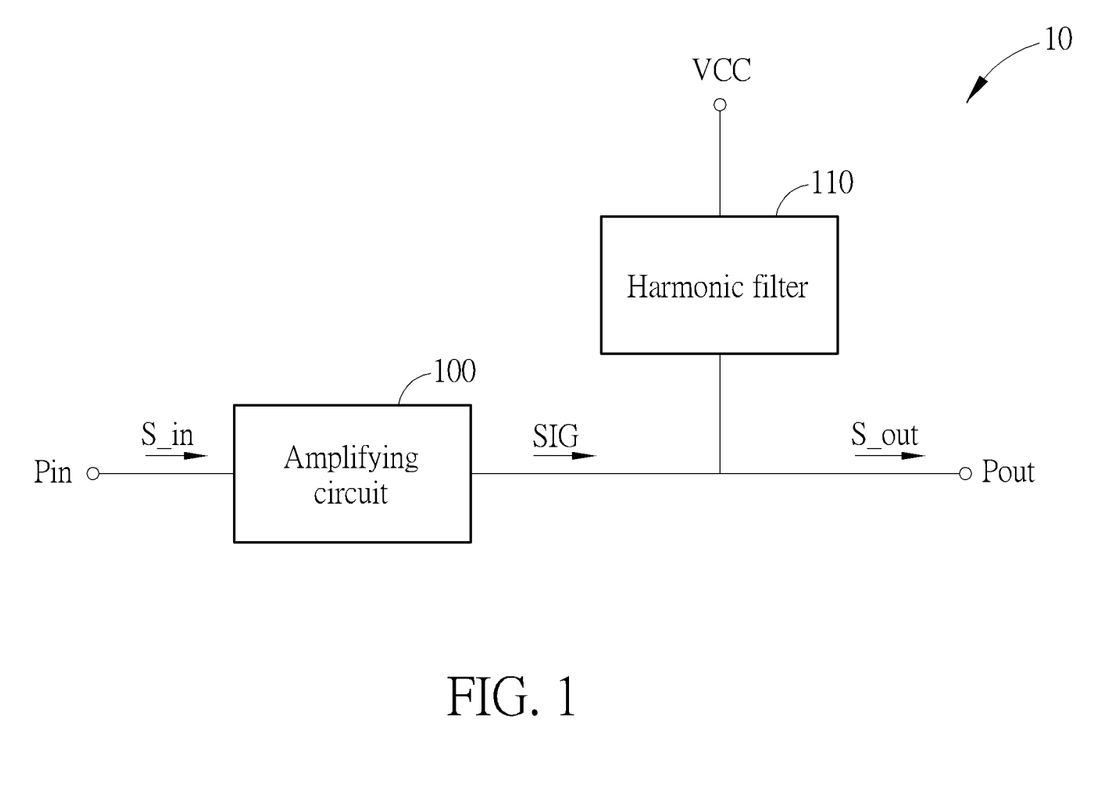
FIG. 1 is a schematic diagram of an amplifier according to an embodiment of the present invention.

FIG. 1 is a schematic diagram of an amplifier 10 (e.g., a power amplifier) according to an embodiment of the present invention. The amplifier 10 includes a signal input end Pin, a voltage input end VCC, an amplifying circuit 100, a harmonic filter 110 and a signal output end Pout. The harmonic filter is coupled between the voltage input end VCC and the amplifying circuit 100, and the signal output end Pout is coupled to the harmonic filter 110 and the amplifying circuit 100. In detail, an input signal S_in is input from the signal input end Pin, and a source voltage is input from the voltage input end VCC and is provided to the amplifying circuit 100 as a working voltage. The amplifying circuit 100 generates and outputs an amplified input signal SIG to an output end of the amplifying circuit 100 according to the input signal S_in input to an input end of the amplifying circuit 100. The amplified input signal SIG has a fundamental signal, a first harmonic and a second harmonic. The first harmonic may be a second order harmonic of the fundamental signal, and the second harmonic may be a third order harmonic of the fundamental signal. Then, the harmonic filter 110 filters out the first harmonic and the second harmonic of the amplified input signal SIG, to restrain the first harmonic and the second harmonic output to the signal output end Pout. The signal output end Pout outputs an output signal S out according to the amplified input signal SIG.

According to the above description, the present invention provides an amplifier including a harmonic filter for filtering the second order harmonic and the third order harmonic of the input signal generated in the circuits. Thus, the effect of the harmonic generated by the input signal passing through the power amplifier can be reduced.

In one embodiment, the amplifying circuit 100 may be an amplifier transistor. In one embodiment, the amplifying circuit 100 may include a plurality of amplifier stage circuits, and each of the plurality of amplifier stage circuits may include an amplifier transistor, respectively. In one embodiment, the signal input end Pin may be coupled to an input end of the amplifier transistor (e.g., a base). In one embodiment, the harmonic filter 110 may be coupled to an output end of the amplifier transistor (e.g., a collector). In one embodiment, a reference end of the amplifier transistor (e.g., an emitter) may be coupled to a reference voltage end V_ref.

Figure 4:
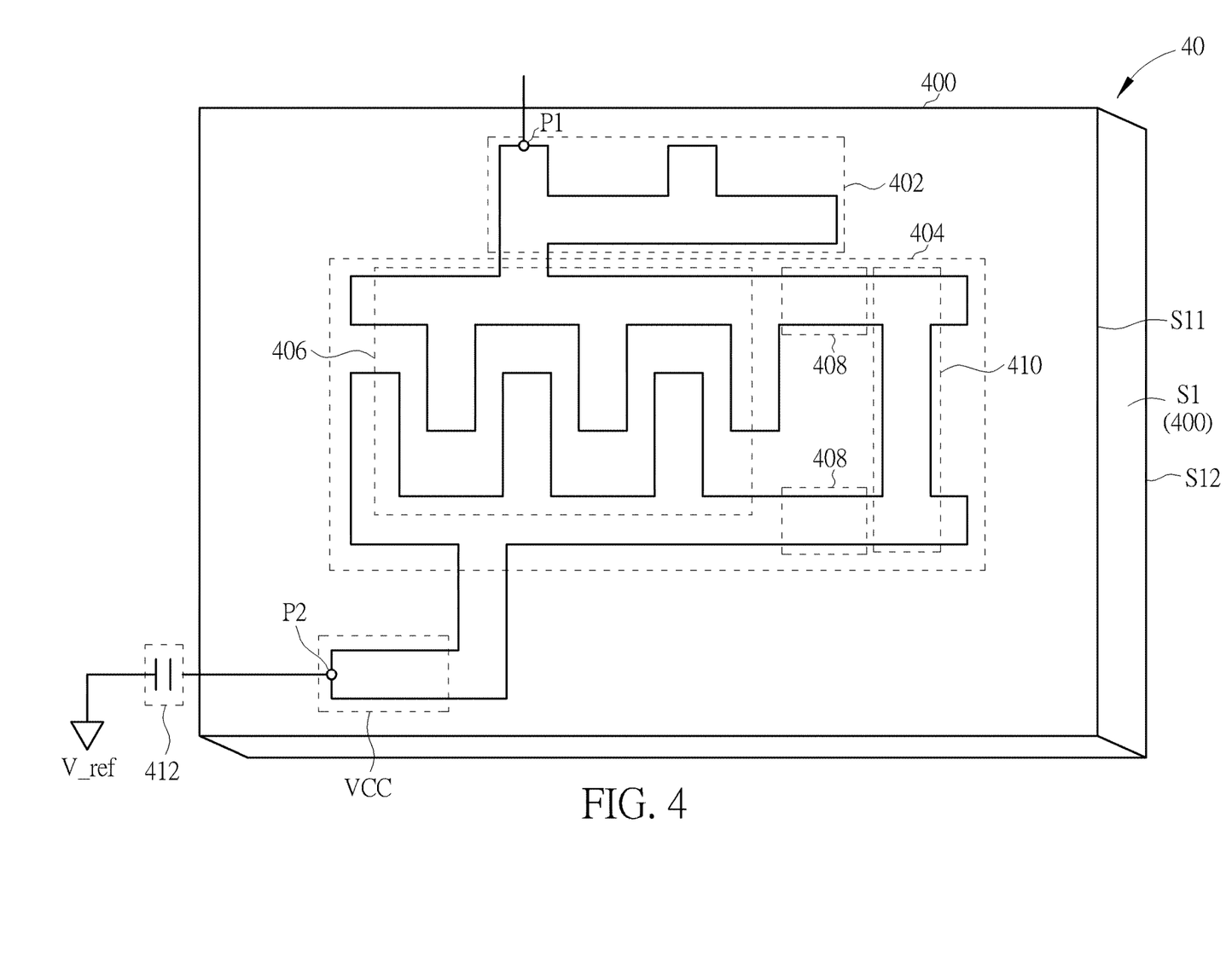
FIG. 4 is a schematic diagram of a layout of a harmonic filter according to an embodiment of the present invention.

Please refer to FIG. 1 and FIG. 4 together. In one embodiment, the amplifier 10 further includes a substrate S1, and the substrate S1 includes a first surface S11 and a second surface S12. The harmonic filter 110 may be at least partially placed at the first surface S11 of the substrate S1. Please refer to FIG. 1, FIG. 4 and FIG. 7B together. In one embodiment, the amplifier further includes a substrate S2, and the substrate S2 includes a first surface and a second surface. The harmonic filter 110 may be at least partially placed between the first surface of the substrate S1 and the second surface of the substrate S2. The amplifying circuit 100 may be placed at the first surface of the substrate S2. In one embodiment, in the amplifier 10, the substrate S1 may be a dielectric-1 layer and the substrate S2 may be a dielectric-2 layer.

In one embodiment, the amplifying circuit 100 may further include a plurality of amplifier stage circuits, and the harmonic filter 110 is coupled between the voltage input end VCC and a last amplifier stage of the plurality of amplifier stage circuits.

In one embodiment, the source voltage of the voltage input end VCC may be 5V, but is not limited thereto. In one embodiment, the reference voltage end V_ref may be a ground voltage, but is not limited thereto.

Figure 2:
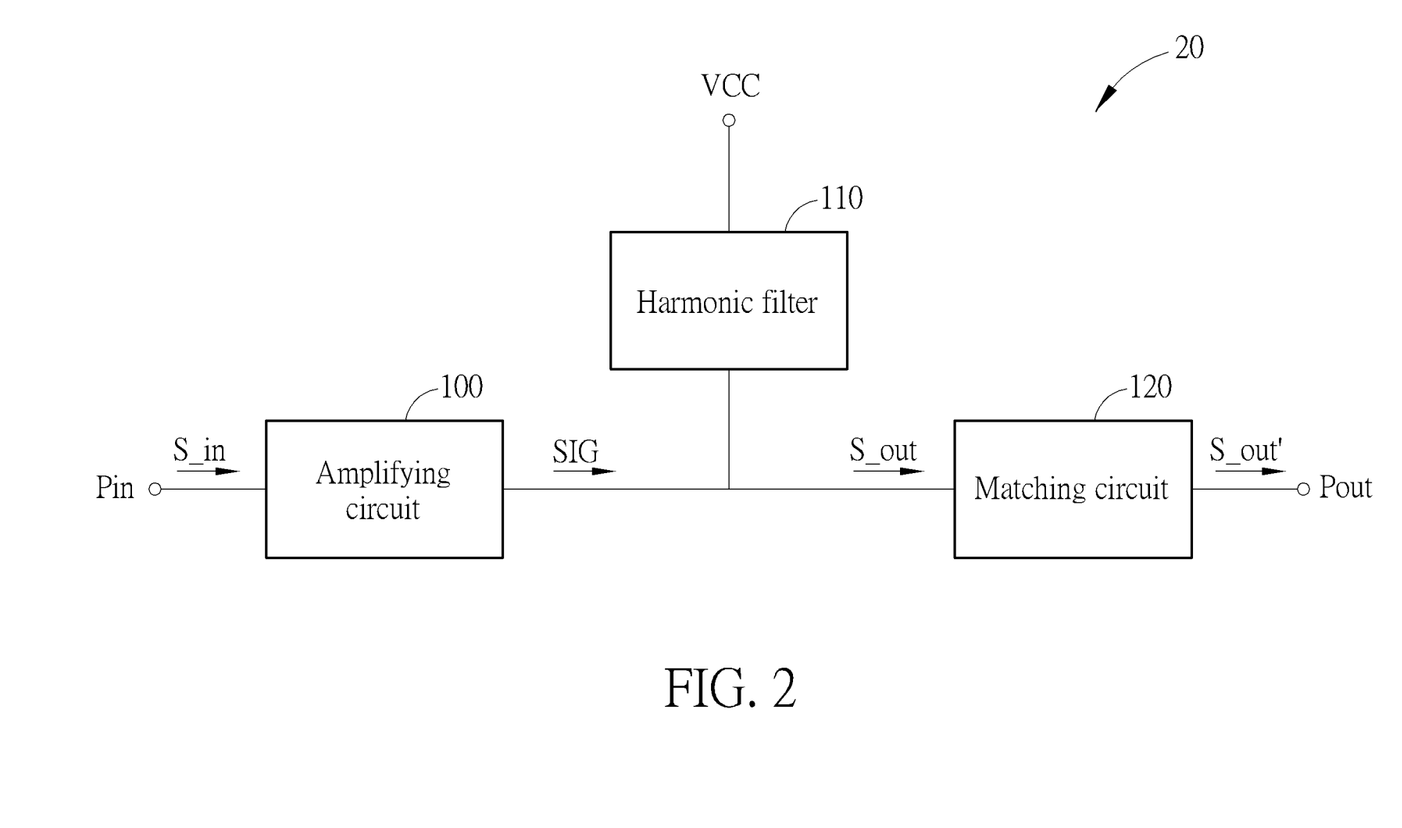
FIG. 2 is a schematic diagram of an amplifier according to an embodiment of the present invention.

FIG. 2 is a schematic diagram of an amplifier 20 (e.g., a power amplifier) according to an embodiment of the present invention. Compared with the amplifier 10, the amplifier 20 further includes an output matching network 120. The output matching network 120 is coupled to the harmonic filter 110 and the signal output end Pout, and is used for providing an output impedance matching to the amplifier 20. The operations and functions of the other circuit elements may be referred to the previous description, and is not repeated thereto. In one embodiment, the output signal S out may include the fundamental signal of the amplified input signal SIG. In one embodiment, the output signal S out' is output in the signal output end Pout after passing through the output matching network 120.

It should be noted that the amplifier 20 provided in the present invention filters harmonic of the amplified input signal SIG in the harmonic filter 110, and the output matching network 120 provides the output impedance matching. That is, the harmonic filter 110 is configured to filter the harmonics on the path from the amplifying circuit 100 to the voltage input end VCC instead of on the path from the amplifying circuit 100 to the signal output end Pout.

Figure 3:
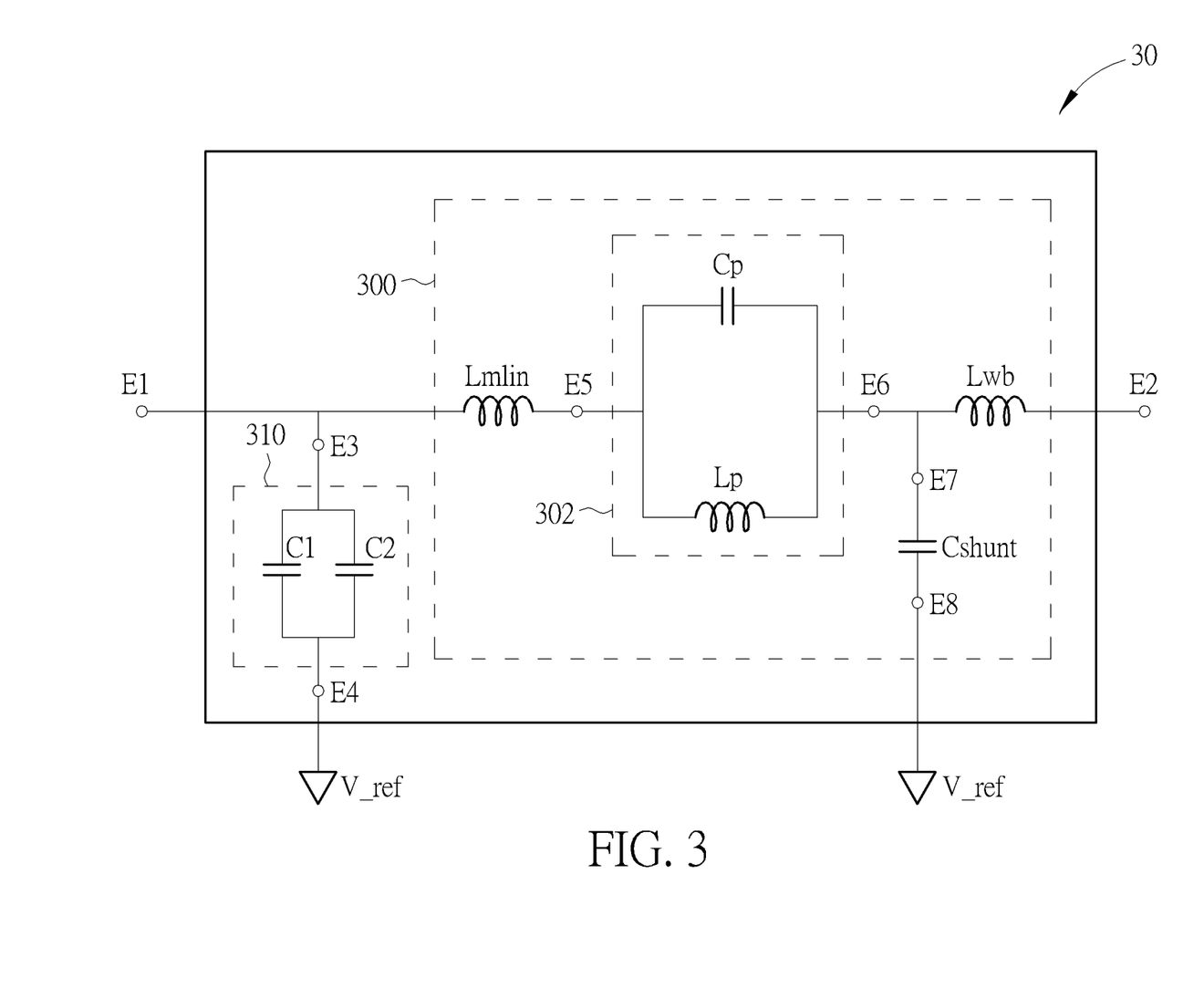
FIG. 3 is a schematic diagram of a harmonic filter according to an embodiment of the present invention.

FIG. 3 is a schematic diagram of a harmonic filter 30 according to an embodiment of the present invention. The harmonic filter 30 may be used for implementing the harmonic filter 110. The harmonic filter 30 includes a resonator 300 and a bypass capacitor circuit 310. The resonator 300 includes a first end E1 and a second end E2. The first end E1 of the resonator 300 may be coupled to the voltage input end VCC, and the second end E2 of the resonator 300 may be coupled to the amplifying circuit 100, for receiving the amplified input signal SIG. The bypass capacitor circuit 310 includes a first end E3 and a second end E4. The first end E3 of the bypass capacitor circuit 310 may be coupled to the voltage input end VCC, and the second end E4 of the bypass capacitor circuit 310 may be coupled to the reference voltage end V_ref. In detail, the amplified input signal SIG includes a fundamental signal, a first harmonic and a second harmonic. The first harmonic may be a second order harmonic of the fundamental signal, and the second harmonic may be a third order harmonic of the fundamental signal. An impedance value of the first harmonic signal and in the resonator 300 and an impedance value of the second harmonic signal in the resonator 300 are smaller than an impedance value of the fundamental signal in the resonator 300. An impedance value of the first harmonic signal in the bypass capacitor circuit 310 and an impedance value of the second harmonic signal in the bypass capacitor circuit 310 are smaller than an impedance value of the fundamental signal in the bypass capacitor circuit 310.

According to the above description, the harmonic filter provided in the present invention enables the second order harmonic and the third order harmonic generated by the input signal passing through the power amplifier to be input to the harmonic filter with a lower impedance, to filter the second order harmonic and the third order harmonic. In addition, compared with the prior art (e.g., the $\lambda/4$ transmission line), the harmonic filter provided in the present invention can filter the second order harmonic and the third order harmonic simultaneously. The harmonic filter has a smaller circuit size, which reduces the area or the volume for placing the harmonic filter, to lower the interference received by the harmonic filter. Thus, the effect of the harmonics generated by the signal passing through the power amplifier can be reduced.

In one embodiment, the bypass capacitor circuit 310 may further include a bypass capacitor C1 and a bypass capacitor C2, wherein the bypass capacitor C1 is coupled in parallel with the capacitor C2. In one embodiment, an impedance value of the first harmonic signal in the bypass capacitor C1 is smaller than an impedance value of the fundamental signal in the bypass capacitor C1. In one embodiment, an impedance value of the second harmonic signal in the bypass capacitor C2 is smaller than an impedance value of the fundamental signal in the bypass capacitor C2. That is, the first harmonic may be filtered according to the resonator 300 and the bypass capacitor C1. The second harmonic may be filtered according to the resonator 300 and the bypass capacitor C2. Thus, the harmonic filter 30 may filter the second order harmonic and the third order harmonic generated by the amplified input signal SIG in the circuit, to reduce the effect caused by the above harmonics.

In one embodiment, the resonator further includes a LC parallel circuit 302. The LC parallel circuit 302 includes at least one capacitor Cp and at least one inductor Lp, wherein the at least one capacitor Cp is coupled in parallel with the at least one inductor Lp. The LC parallel circuit 302 has a first end E5 and a second end E6. The LC parallel circuit 302 is coupled between the first end E1 and the second end E2 of the resonator 300. In one embodiment, the resonator 300 further includes an inductor Lmlin and a capacitor Cshunt. The inductor Lmlin is coupled between the first end E5 of the LC parallel circuit 302 and the first end E1 of the resonator 300. The capacitor Cshunt includes a first end E7 and a second end E8. The first end E7 of the capacitor Cshunt may be coupled between the second end E6 of the LC parallel circuit 302 and the second end E2 of the resonator 300, and the second end E8 of the capacitor Cshunt may be coupled to the reference voltage end V_ref. In one embodiment, the at least one capacitor Cp, the at least one inductor Lp, the inductor Lmlin or the capacitor Cshunt may be composed of at least one microstrip. In one embodiment, the first end of the at least one capacitor Cp, the at least one inductor Lp, the inductor Lmlin and the capacitor Cshunt may be placed at a first surface of a substrate (e.g., the substrate S1). In one embodiment, the second end of the capacitor Cshunt may be placed at a second surface of the substrate.

In one embodiment, the capacitor Cshunt may be an open-stub capacitor. That is, the capacitor Cshunt may be generated according to a parasitic effect. In one embodiment, the capacitor Cshunt may be a capacitor generated according to the parasitic effect of a parallel plate capacitor. In one embodiment, the capacitor Cshunt may be a capacitor generated according to the parasitic effect of a metal layer (where the resonator 300 is formed) and a ground metal layer (not shown, wherein the resonator 300 is placed between the first substrate S1 and the second substrate S2, and the metal ground layer is placed below the second surface of the first substrate S1) if the harmonic filter 30 is placed in an amplifier with the dielectric-1 layer and the dielectric-2 layer. In one embodiment, the at least one capacitor Cp may be at least one fringing capacitor. In one embodiment, the at least one capacitor Cp may be at least one interdigitated fringing capacitor. In one embodiment, a capacitance value of the at least one capacitor Cp is related to a number of the fringing capacitance units. For example, if the at least one capacitor Cp has n fringing capacitance units, the capacitance value of the at least one capacitor Cp is n*Δc, wherein Δc is the capacitance value of a single fringing capacitance unit.

In one embodiment, the at least one inductor Lp may include a distribution inductor and a transmission-line inductor. In one embodiment, an inductance value of the at least one inductor Lp is a sum of an inductance value of the distribution inductor and an inductance value of the transmission-line inductor. For example, if the inductance value of the distribution inductor is ΔL1 and the inductance value of the transmission-line inductor is ΔL2, the inductance value of the at least one inductor Lp is ΔL1+ΔL2.

In one embodiment, the resonator 300 may further include an inductor Lwb. The inductor Lwb may be coupled between the first end E7 of the capacitor Cshunt and the second end E2 of the resonator 300. In one embodiment, the inductor Lwb may be a bondwire. That is, a material forming the inductor Lwb may be different from a material forming the at least one capacitor Cp, the at least one inductor Lp, the inductor Lmlin and the capacitor Cshunt. In other words, a material used for the inductor Lwb may be different from a material used for the at least one capacitor Cp, the at least one inductor Lp, the inductor Lmlin and the capacitor Cshunt.

In one embodiment, the harmonic filter 30 may be placed on a printed circuit board (PCB) complying with the FR-4 standard. In one embodiment, the harmonic filter 30 may be placed on a ceramic substrate. In one embodiment, the harmonic filter 30 may be implemented inside or outside a package, to reduce an area or volume for placing the harmonic filter 30. In one embodiment, the harmonic filter 30 may be applied on a multi-chip module (MCM), to reduce the area or volume for placing the harmonic filter 30. Thus, the harmonic filter 30 provided in the present invention may have a smaller circuit size, and may reduce the area or volume for placing the harmonic filter 30, to reduce the interference received by the harmonic filter 30.

In one embodiment, the reference voltage end V_ref may be a ground voltage or a common voltage, but is not limited thereto. In one embodiment, the source voltage of the voltage input end VCC may be a fixed voltage, wherein a corresponding voltage level of the fixed voltage could be set, for example, from 3V to 5V, but is not limited thereto.

FIG. 4 is a schematic diagram of a layout of a harmonic filter 40 according to an embodiment of the present invention. The harmonic filter 40 may be used for implementing the harmonic filter 30. The substrate S1 (400) has a first surface S11 and a second surface S12. The harmonic filter 40 may be at least partially placed on the first surface S11 of the substrate S1 (400), and the second surface S12 is configured with a conductive layer to form a ground layer (not shown in FIG. 4). The harmonic filter 40 may include an open-stub capacitor 402, a LC parallel circuit 404, the voltage input end VCC and a bypass capacitor circuit 412. The open-stub capacitor 402 may be placed at the first surface S11, to generate a capacitor via the parasitic effect of a parallel plate capacitor generated by the ground layer placed at the second surface S12. The LC parallel circuit 404 may be placed at the first surface S11 and may include at least one interdigitated fringing capacitor 406, a distribution inductor 408 and a transmission-line inductor 410. The LC parallel circuit 404 may be coupled to the open-stub capacitor 402, and the voltage input end VCC may be coupled to the LC parallel circuit 404. The bypass capacitor circuit 412 may be placed inside or outside the substrate S1 (400) and may be coupled between the voltage input end VCC and the reference voltage end V_ref. In the LC parallel circuit 404, the distribution inductor 408 may be coupled in series with the transmission-line inductor 410, and the at least one interdigitated fringing capacitor 406 may be coupled in parallel with the distribution inductor 408 and the transmission-line inductor 410. The bypass capacitor circuit 412 may be the bypass capacitor circuit 310, and is not limited thereto. The harmonic filter 40 may have a port P1 and a port P2. The port P1 may be placed in the open-stub capacitor 402, and the port P2 may be placed near the voltage input end VCC. The first harmonic and the second harmonic of the amplified input signal SIG are input to the harmonic filter 40 through the port P1 via a bondwire (Lwb (not shown in FIG. 4)). It should be noted that the number of the at least one interdigitated fringing capacitor 406 and the length of the distribution inductor and the transmission-line inductor 410 may be correspondingly adjusted according to different design requirements, to reduce the design difficulty and have a smaller circuit size, which may reduce the area or volume for placing the harmonic filter to reduce the interference received by the harmonic filter.

The operations of the harmonic filter 30 can be applied to the harmonic filter 40, and is not repeated thereto.

Figure 5:
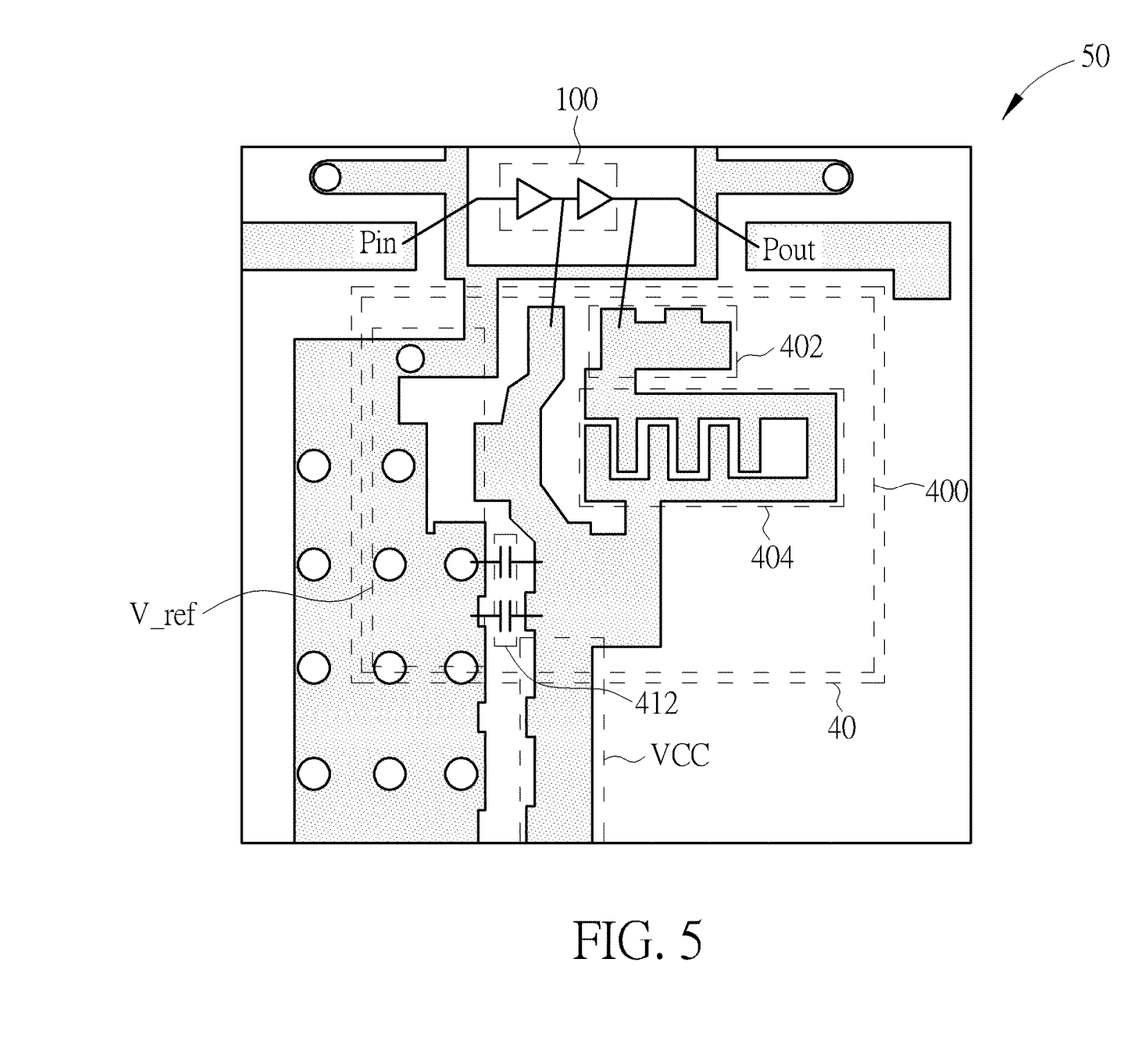
FIG. 5 is a schematic diagram of a layout of an amplifier according to an embodiment of the present invention.

FIG. 5 is a schematic diagram of a layout of an amplifier 50 according to an embodiment of the present invention. The amplifier 50 may be used for implementing the amplifier 10. The amplifier 50 includes the signal input end Pin, the voltage input end VCC, the amplifying circuit 100, the harmonic filter 40 and the signal output end Pout. The harmonic filter 40 may be implemented on a circuit board outside the package, for example, to be placed at the substrate 400 outside the amplifying circuit 100. The harmonic filter includes the open-stub capacitor 402, the LC parallel circuit 404 and the bypass capacitor circuit 412. The amplifying circuit 100 is coupled to the harmonic filter 40 via at least one bondwire. The coupling method of other circuit elements may be referred to the previous description, and is not repeated thereto.

According to FIG. 5, an input signal (e.g., the input signal S_in) is input from the signal input end Pin, and is amplified in the amplifying circuit 100. Then, the second order harmonic and the third order harmonic of the amplified input signal may be input to the harmonic filter 40 via at least one bondwire. Thus, the second order harmonic and the third order harmonic generated by an output signal (e.g., the output signal S out) of the signal output end Pout may be filtered. In addition, compared with the prior art, the layout area of the harmonic filter 40 is smaller than that of the $\lambda/4$ transmission line, which may reduce the interference received by the output signal.

The operations of the harmonic filter 40 may be referred to the previous description, and is not repeated thereto.

In one embodiment, the harmonic filter 40 may be placed at the first surface of the substrate 400. In one embodiment, the harmonic filter 40 may be coupled between the voltage input end VCC and the last amplifier stage of a plurality of amplifier stage circuits (in FIG. 5, there are 2 amplifier stage circuits as an example of the amplifying circuit 100) if the amplifying circuit 100 includes a plurality of amplifier stage circuits (in FIG. 5, there are 2 amplifier stage circuits as an example). In one embodiment, the output end of the other amplifier stages of the plurality of amplifier stage circuits (in FIG. 5, the first amplifier stage is taken as an example) of the amplifying circuit 100 may be coupled to the voltage input end VCC via at least one circuit connection line (e.g., at least one microstrip) if the amplifying circuit 100 further includes a radio frequency (RF) choke. In one embodiment, the amplifier 50 may further include an output matching network (not shown in FIG. 5) alternatively, to implement the amplifier 20. The output matching network is coupled to the harmonic filter 40 and the signal output end Pout, to provide an output impedance matching to the amplifier 10. The operations and functions may be referred to the previous description, and is not repeated thereto.

Figure 6:
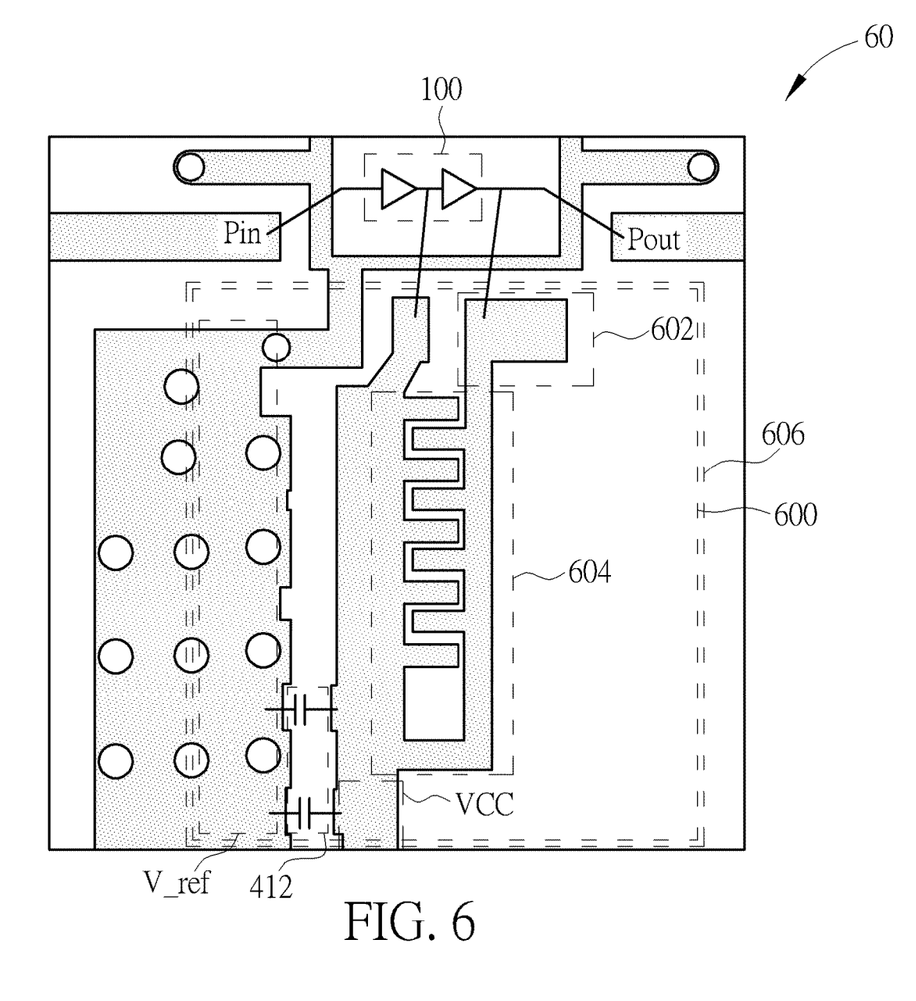
FIG. 6 is a schematic diagram of a layout of an amplifier according to an embodiment of the present invention.

FIG. 6 is a schematic diagram of a layout of an amplifier 60 according to an embodiment of the present invention. The amplifier 60 may be used for implementing the amplifier 10. The amplifier 60 includes the signal input end Pin, the amplifying circuit 100, a harmonic filter 600 and the signal output end Pout. The harmonic filter 600 includes an open-stub capacitor 602, a LC parallel circuit 604, the voltage input end VCC and the bypass capacitor circuit 412, and may be implemented on a circuit board outside the package, for example, to be placed at a substrate 606 outside the amplifying circuit 100. The amplifying circuit 100 is coupled to the harmonic filter 600 via at least one bondwire. Compared with FIG. 5, the layouts of the open-stub capacitors 602 and 402 are different, and the layouts of the LC parallel circuits 604 and 404 are different. In addition, the layout area of the harmonic filter 600 is also smaller than that of the $\lambda/4$ transmission line, which may reduce the interference received by the output signal. The operations applied to the amplifier 50 may be applied to the amplifier 60, and is not repeated thereto.

In one embodiment, the amplifier 60 may further include an output matching network (not shown in FIG. 6) alternatively, to implement the amplifier 20. The output matching network is coupled to the harmonic filter 600 and the signal output end Pout, to provide the output impedance matching to the amplifier 10. The operations and the functions may be referred to the previous description, and is not repeated thereto.

Figure 7A:
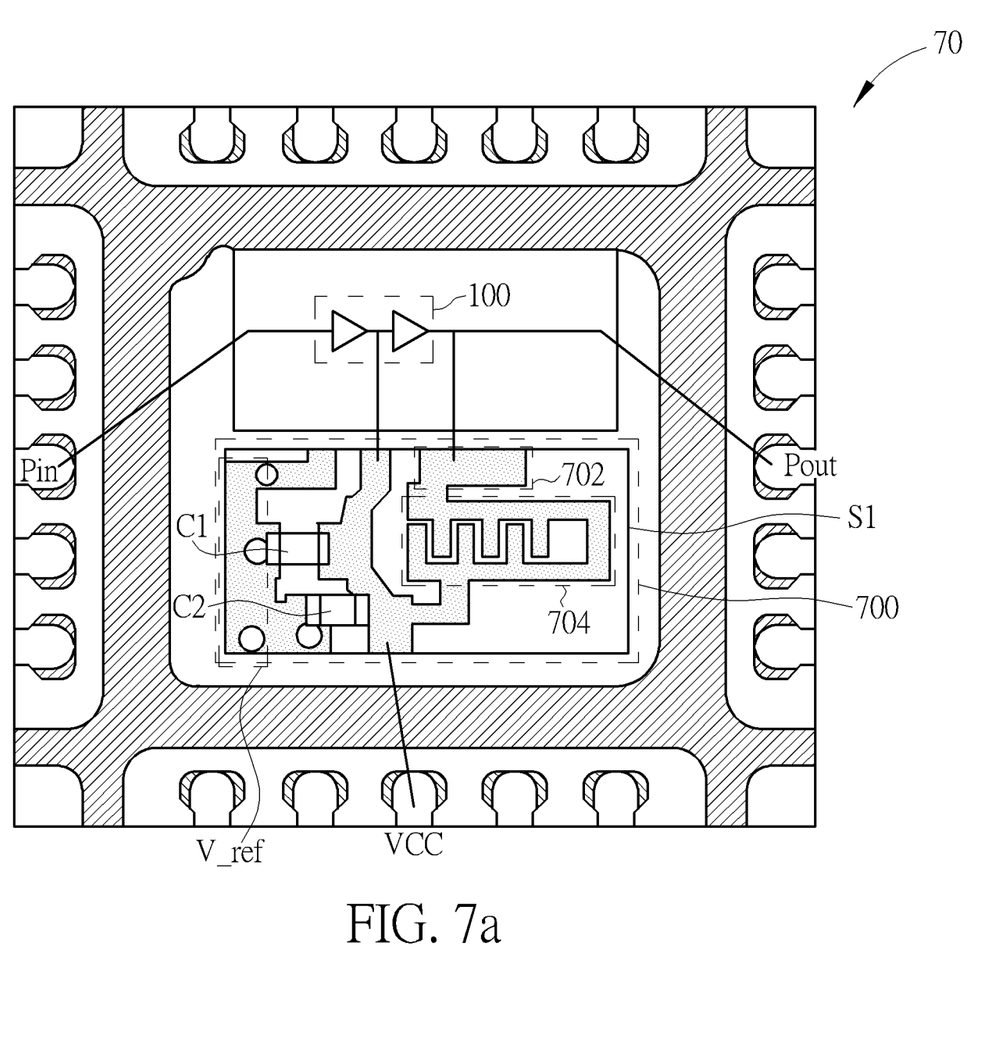
FIG. 7A is a schematic diagram of a layout of an amplifier according to an embodiment of the present invention.

FIG. 7A is a schematic diagram of a layout of an amplifier 70 according to an embodiment of the present invention. The amplifier 70 may be used for implementing the amplifier 10. The amplifier 70 may be implemented inside the package. For example, a harmonic filter 700 and the amplifying circuit 100 are jointly placed at the same surface of a leadframe inside the same package. The amplifier 70 includes the signal input end Pin, the voltage input end VCC, the amplifying circuit 100, the harmonic filter 700 and the signal output end Pout. The harmonic filter 700 may include an open-stub capacitor 702, a LC parallel circuit 704, the bypass capacitor C1 and the bypass capacitor C2. The harmonic filter may be placed at the first surface of the substrate S1.

In one embodiment, the harmonic filter 700 may be the harmonic filter 30, the harmonic filter 40 or the harmonic filter 600, and is not limited thereto. In one embodiment, the open-stub capacitor 702 may be the open-stub capacitor 402 or the open-stub capacitor 602, and is not limited thereto. In one embodiment, the LC parallel circuit 704 may be the LC parallel circuit 404 or the LC parallel circuit 604, and is not limited thereto.

In one embodiment, the amplifier 70 may further include an output matching network (not shown in FIG. 7A) alternatively, to implement the amplifier 20. The output matching network is coupled to the harmonic filter 700 and the signal output end Pout, for providing the output impedance matching to the amplifier 10. The operations and the functions may be referred to the previous description, and is not repeated thereto. The output matching network and the amplifying circuit 100 are jointly placed inside the package. The operations applied to the harmonic filter 30 or the harmonic filter 40 may be applied to the harmonic filter 70, and is not repeated thereto.

Figure 7B:
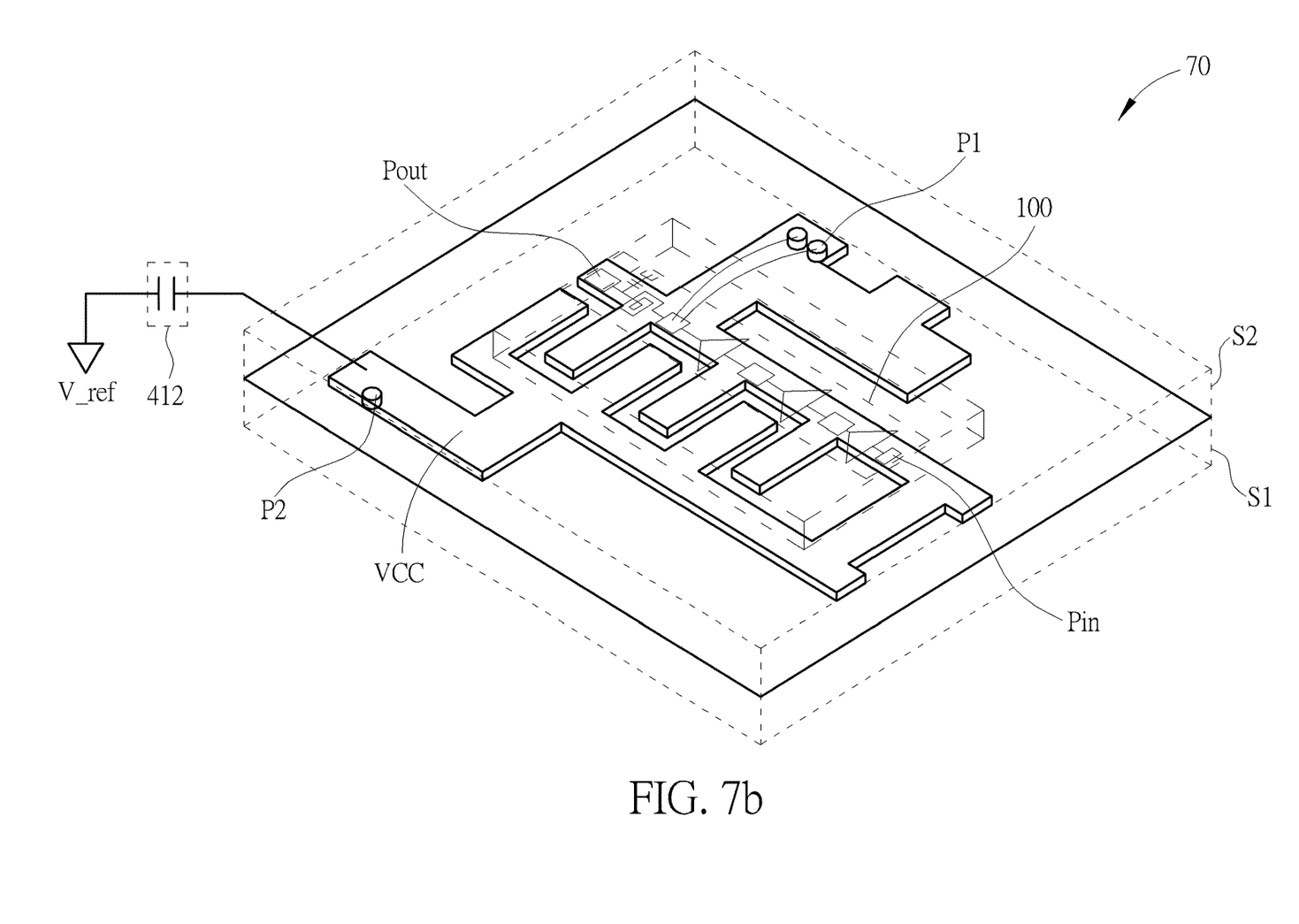
FIG. 7B is a schematic diagram of a layout of an amplifier according to an embodiment of the present invention.

FIG. 7B is a schematic diagram of another layout of an amplifier 70 according to an embodiment of the present invention. The amplifier 70 may be also used for implementing the amplifier 10. Compared with FIG. 7A, the amplifier 70 further includes a substrate S2, and the substrate S2 has a first surface and a second surface. The harmonic filter may be at least partially placed between the first surface of the substrate S1 and the second surface of the substrate S2, and the amplifying circuit 100 may be placed at the first surface of the substrate S2. In one embodiment, the amplifier 70 may further include an output matching network (not shown in FIG. 7B) alternatively, to implement the amplifier 20. The output matching network and the amplifying circuit 100 may be jointly placed at the first surface of the substrate S2. The operations and the functions may be referred to the previous description, and is not repeated thereto. For ease of the description, the harmonic filter is drawn with solid lines, while the other elements are drawn with dashed lines.

According to FIG. 7A and FIG. 7B, the amplifier provided in the present invention may be implemented inside a single package or on a multi-layer substrate, to reduce the area or volume for placing the circuits and to further reduce the interference received by the circuits.

Figure 8A:
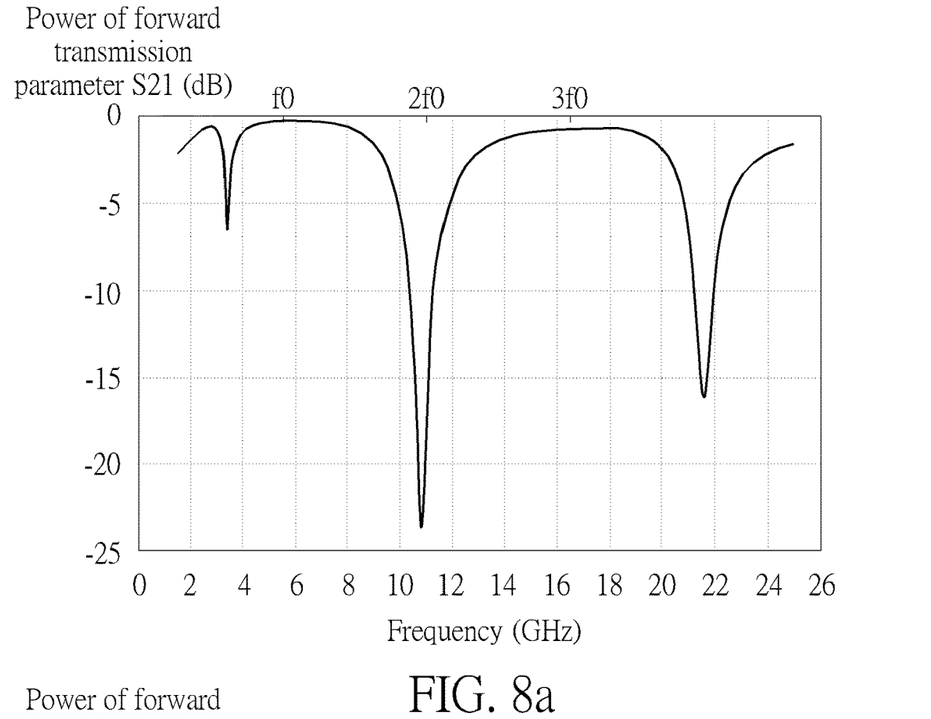
FIG. 8A is a schematic diagram of a power filtering performance of a power amplifier in the prior art.
Figure 8B:
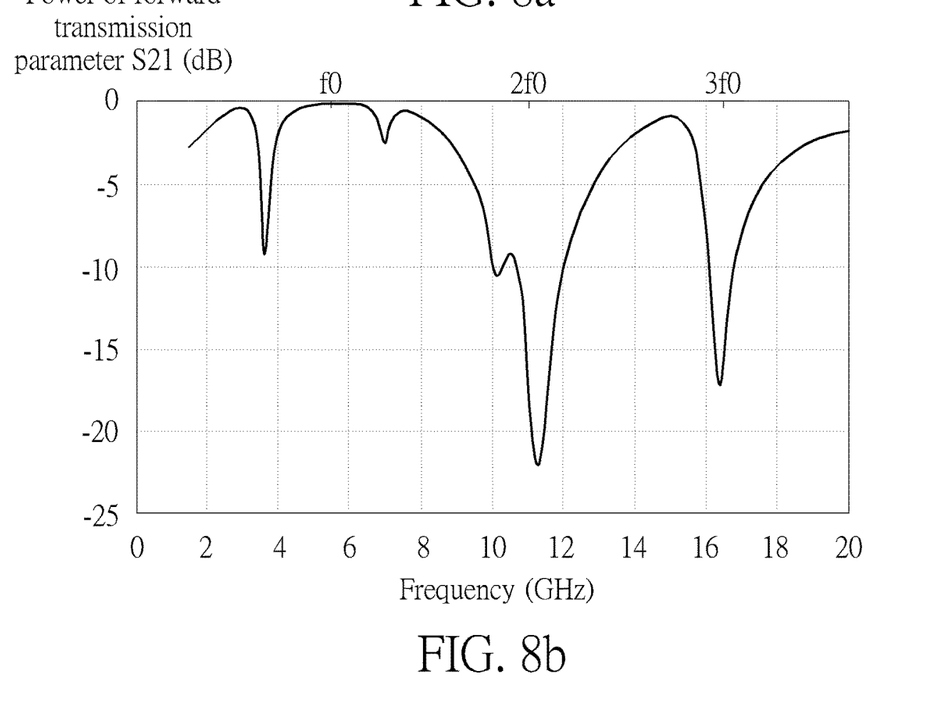
FIG. 8B is a schematic diagram of a power filtering performance of a power amplifier according to an embodiment of the present invention.

FIG. 8A is a schematic diagram of a power filtering performance of a power amplifier applying the $\lambda/4$ transmission line in the prior art. FIG. 8B is a schematic diagram of a power filtering performance of the power amplifier 10 with the harmonic filter 110 according to an embodiment of the present invention. In FIG. 8A and FIG. 8B, the horizontal axis represents the frequency, and the vertical axis represents the power of forward transmission parameter S21, wherein the unit of the frequency is gigahertz (GHz) and the unit of power of forward transmission parameter S21 is decibel (dB). In this embodiment, the fundamental signal of the frequency 5.5 GHz (e.g., f0=5.5 GHz) is taken as an example. It should be noted that the present invention may be applied to the fundamental signal of any frequency, and is not limited thereto. In the situation of the second order harmonic (2f0), according to FIG. 8A, the signal has a better power filtering effect in the frequency band 10 GHz-12 GHz. In contrast, according to FIG. 8B, the signal has a better power filtering effect in the frequency band 9 GHz-13 GHz. On the other hand, in the situation of the third order harmonic (3f0), the $\lambda/4$ transmission line cannot filter the third order harmonic. Thus, the power amplifier applying the $\lambda/4$ transmission line has a worse power filtering effect in the frequency band 3f0 and its adjacent frequency bands as shown in 3f0 of FIG. 8A. In contrast, the amplifier provided in the present invention still has a better power filtering effect in the frequency band 3f0 and its adjacent frequency bands. Thus, compared with the prior art, the amplifiers 10 or 20 provided in the present invention has a wider signal bandwidth.

Figure 9:
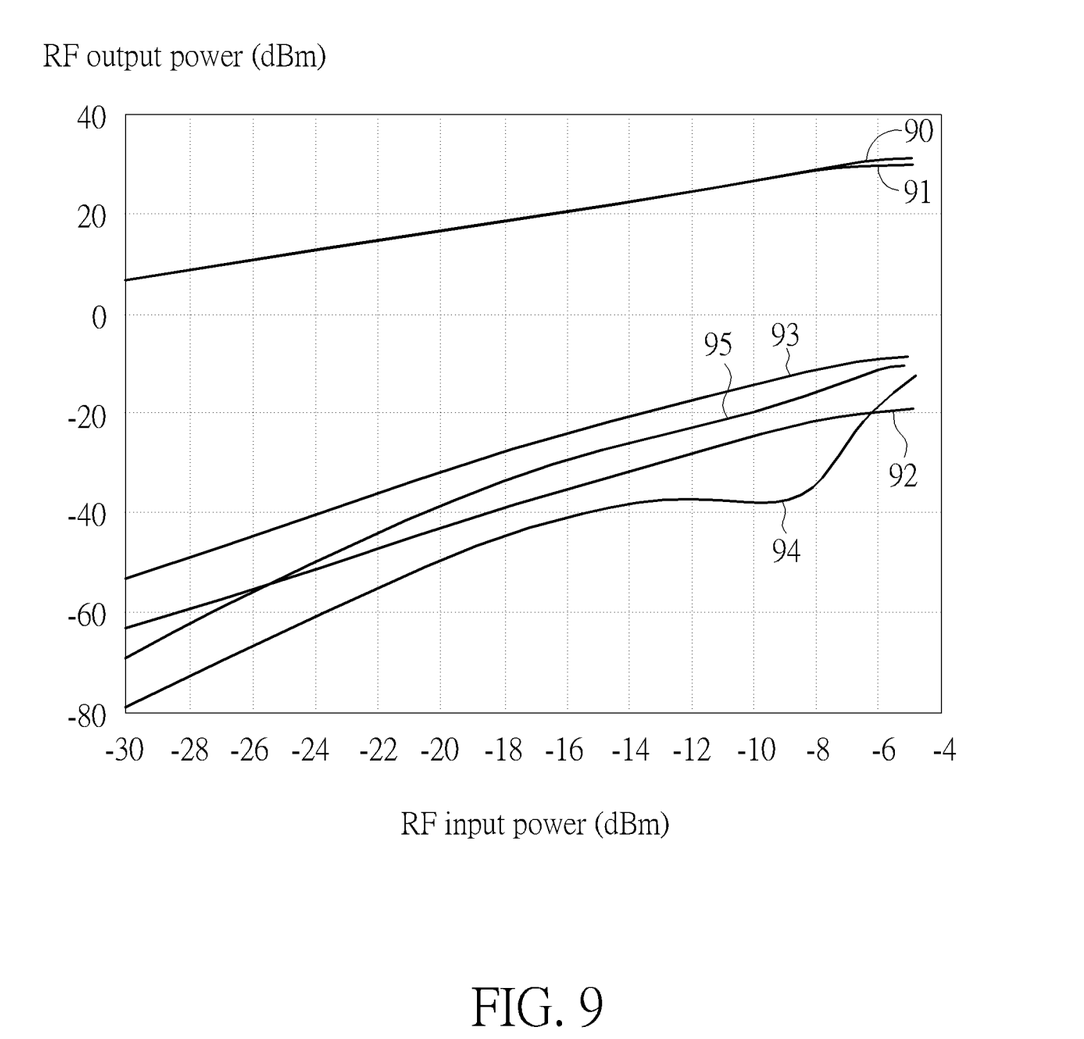
FIG. 9 is a comparison diagram of a radio frequency output power between a power amplifier in the prior art and an amplifier according to an embodiment of the present invention.

FIG. 9 is a comparison diagram of a radio frequency output power between a power amplifier only with the RF choke in the prior art and the amplifier 10 or 20 with the harmonic filter 110 under different RF input power according to an embodiment of the present invention. In FIG. 9, the unit of the RF input power and the RF output power is decibel relative to one milliwatt (dBm). The input signals of the power amplifier mainly filtered by the RF choke and the amplifier 10 or 20 are the same. However, the amplified signals of the power amplifiers mainly filtered by the RF choke and that of the amplifier 10 or 20 have the same fundamental signal, while the second order harmonic and third order harmonic of the amplified signal of the power amplifiers mainly filtered by the RF choke are different from the second order harmonic and the third order harmonic of the aforementioned amplifier 10 or 20. A simulation curve 90 is the RF output power of the fundamental signal of the amplifier 10 or 20 according to an embodiment of the present invention, and a simulation curve 91 is the RF output power of the fundamental signal of the power amplifier mainly filtered by the RF choke. A simulation curve 92 is the RF output power of the second order harmonic of the amplifier 10 or 20 according to an embodiment of the present invention, and a simulation curve 93 is the RF output power of the second order harmonic of the power amplifier mainly filtered by the RF choke. A simulation curve 94 is the RF output power of the third order harmonic of the amplifier 10 or 20 according to an embodiment of the present invention, and a simulation curve 95 is the RF output power of the third order harmonic of the power amplifier mainly filtered by the RF choke. In detail, regarding the fundamental signal, the simulation curves 90 and 91 are almost coincident, which means that the power amplifier mainly filtered by the RF choke and the amplifier 10 or 20 according to an embodiment of the present invention have a close RF output power. However, regarding to the second order harmonic, compared with the simulation curve 93, the simulation curve 92 has a lower RF output power. That is, the amplifiers 10 or 20 according to an embodiment of the present invention may reduce the additional power generated by the second order harmonic via filtering the second order harmonic. Then, regarding the third order harmonic, compared with the simulation curve 95, the simulation curve 94 also has a lower RF output power. Thus, the amplifiers 10 or 20 according to an embodiment of the present invention may also reduce the additional power generated by the third order harmonic. In conclusion, the amplifiers 10 or 20 according to an embodiment of the present invention may reduce the signal distortion due to the above harmonics. In the situation that the second order harmonic and the third order harmonic can be filtered, the amplifiers 10 or 20 according to an embodiment of the present invention may reduce the power loss. Thus, the amplifiers 10 or 20 according to an embodiment of the present invention may have a lower intermodulation distortion (IMD).

In conclusion, the present invention provides an amplifier for handling and filtering the second order harmonic and the third order harmonic generated by the input signal passing through the amplifier. Thus, the amplifier with the harmonic filter may have a wider signal bandwidth. In addition, the present invention may also reduce the area or volume for placing the circuits, to reduce the interference received by the harmonic filter, and to further improve the performance and the efficiency of the amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier, comprising:
   a signal input end, for inputting an input signal;
   a voltage input end, for inputting a source voltage;
   an amplifying circuit, for generating an amplified input signal according to the input signal, and the amplified input signal comprises a fundamental signal, a first harmonic signal and a second harmonic signal, wherein the first harmonic signal is a second order harmonic of the fundamental signal, and the second harmonic signal is a third order harmonic of the fundamental signal;
   a harmonic filter, coupled between the voltage input end and the amplifying circuit, for filtering the first harmonic signal and the second harmonic signal, and comprising:
      a bypass capacitor circuit, comprising;
         a first end, coupled to the voltage input end; and
         a second end, coupled to a reference voltage end, wherein a fourth impedance value of the first harmonic signal and a fifth impedance value of the second harmonic signal in the bypass capacitor circuit are smaller than a sixth impedance value of the fundamental signal in the bypass capacitor circuit; and
   a signal output end, coupled to the harmonic filter, for outputting an output signal according to the amplified input signal.

2. The amplifier of claim 1, wherein the harmonic filter further comprises:
   a resonator, comprising;
      a first end, coupled to the voltage input end; and
      a second end, coupled to the amplifying circuit, wherein a first impedance value of the first harmonic signal and a second impedance value of the second harmonic signal in the resonator are smaller than a third impedance value of the fundamental signal in the resonator.

3. The amplifier of claim 1, wherein the bypass capacitor circuit further comprises:
   a first bypass capacitor, wherein a seventh impedance value of the first harmonic signal in the first bypass capacitor is smaller than an eighth impedance value of the fundamental signal in the first bypass capacitor; and
   a second bypass capacitor, coupled in parallel with the first bypass capacitor, wherein a ninth impedance value of the second harmonic signal in the second bypass capacitor is smaller than a tenth impedance value of the fundamental signal in the second bypass capacitor.

4. The amplifier of claim 2, wherein the resonator further comprises:
a LC parallel circuit, comprising at least one first capacitor and at least one inductor, wherein the at least one first capacitor is coupled in parallel with the at least one first inductor, and the LC parallel circuit is coupled between the first end of the resonator and the second end of the resonator.

5. The amplifier of claim 4, wherein the resonator further comprises:
a second inductor, coupled between the LC parallel circuit and the first end of the resonator; and
a second capacitor, comprising;
a first end, coupled between the LC parallel circuit and the second end of the resonator; and
a second end, coupled to the reference voltage end.

6. The amplifier of claim 5, wherein the at least one first capacitor, the at least one first inductor, the second inductor and the second capacitor are composed of at least one microstrip.

7. The amplifier of claim 6, wherein the amplifier further comprises:
a first substrate, comprising a first surface and a second surface, wherein the at least one first capacitor, the at least one first inductor, the first end of the second capacitor and the second inductor are placed at the first surface of the first substrate.

8. The amplifier of claim 7, wherein the second end of the second capacitor is placed at the second surface of the first substrate.

9. The amplifier of claim 8, wherein the second capacitor is an open-stub capacitor.

10. The amplifier of claim 7, wherein the at least one first capacitor is at least one fringing capacitor.

11. The amplifier of claim 7, wherein the amplifying circuit and the harmonic filter are jointly placed on a leadframe inside a package.

12. The amplifier of claim 7, wherein the amplifier further comprises
a second substrate, and the resonator is placed between the first substrate and the second substrate.

13. The amplifier of claim 5, wherein the resonator further comprises:
a third inductor, coupled between the second capacitor and the second end of the resonator.

14. The amplifier of claim 13, wherein the third inductor is a bondwire.

15. The amplifier of claim 1, wherein the amplifying circuit further comprises a plurality of amplifier stage circuits, and the harmonic filter is coupled between the voltage input end and a last amplifier stage of the plurality of amplifier stage circuits.

16. The amplifier of claim 1, wherein the amplifier further comprises:
an output matching network, coupled to the amplifying circuit and the signal output end, for providing an output impedance matching to the amplifier.

17. A harmonic filter, comprising:
a resonator, comprising;
a first end, coupled to a voltage input end; and
a second end, for receiving an input signal, wherein the input signal comprises a fundamental signal, a first harmonic signal and a second harmonic signal, and a first impedance value of the first harmonic signal and a second impedance value of the second harmonic signal in the resonator are smaller than a third impedance value of the fundamental signal in the resonator; and
a bypass capacitor circuit, comprising;
a first end, coupled to the voltage input end; and
a second end, coupled to a reference voltage end, wherein a fourth impedance value of the first harmonic signal and a fifth impedance value and the second harmonic signal in the bypass capacitor circuit are smaller than a sixth impedance value of the fundamental signal in the bypass capacitor circuit.

18. The harmonic filter of claim 17, wherein the bypass capacitor circuit further comprises:
a first bypass capacitor, wherein a seventh impedance value of the first harmonic signal in the first bypass capacitor is smaller than an eighth impedance value of the fundamental signal in the first bypass capacitor; and
a second bypass capacitor, coupled in parallel with the first bypass capacitor, wherein a ninth impedance value of the second harmonic signal in the second bypass capacitor is smaller than a tenth impedance value of the fundamental signal in the second bypass capacitor.

19. The harmonic filter of claim 17, wherein the resonator further comprises:
a LC parallel circuit, comprising at least one first capacitor and at least one inductor, wherein the at least one first capacitor is coupled in parallel with the at least one first inductor, and the LC parallel circuit is coupled between the first end of the resonator and the second end of the resonator.

20. The harmonic filter of claim 19, wherein the resonator further comprises:
a second inductor, coupled between the LC parallel circuit and the first end of the resonator; and
a second capacitor, comprising;
a first end, coupled between the LC parallel circuit and the second end of the resonator; and
a second end, coupled to the reference voltage end.

* * * * *